US012738329B2

(12) United States Patent
Kim et al.

(10) Patent No.: US 12,738,329 B2
(45) Date of Patent: Sep. 15, 2026

(54) SEMICONDUCTOR MEMORY DEVICE AND METHOD OF OPERATING THE SAME

(71) Applicant: SK hynix Inc., Gyeonggi-do (KR)

(72) Inventors: Mu Sun Kim, Gyeonggi-do (KR); Yun Cheol Kim, Gyeonggi-do (KR); Byoung Jun Park, Gyeonggi-do (KR); Dae Myeong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 115 days.

(21) Appl. No.: 18/898,673

(22) Filed: Sep. 27, 2024

(65) Prior Publication Data

US 2025/0336448 A1 Oct. 30, 2025

(30) Foreign Application Priority Data

Apr. 24, 2024 (KR) ........................ 10-2024-0054790

(51) Int. Cl.
*G11C 16/26* (2006.01)
*G11C 16/30* (2006.01)
*G11C 16/04* (2006.01)

(52) U.S. Cl.
CPC .............. *G11C 16/26* (2013.01); *G11C 16/30* (2013.01); *G11C 16/0483* (2013.01)

(58) Field of Classification Search
CPC ..... G11C 16/26; G11C 16/30; G11C 16/0483; G11C 11/5642; G11C 16/08; G11C 16/3418; G11C 16/349; G11C 16/12; G11C 7/04
USPC .................................................... 365/185.11
See application file for complete search history.

(56) References Cited

U.S. PATENT DOCUMENTS

2019/0096492 A1* 3/2019 Cai ........................ G11C 29/44

FOREIGN PATENT DOCUMENTS

KR 10-2020-0095903 A 8/2020
KR 10-2244618 B1 4/2021

* cited by examiner

*Primary Examiner* — Huan Hoang
(74) *Attorney, Agent, or Firm* — IP & T GROUP LLP

(57) ABSTRACT

Provided herein are a semiconductor memory device and a method of operating the same. The semiconductor memory device may include a memory block including a plurality of memory cells, a voltage generation circuit configured to generate a read voltage and a pass voltage to be applied to word lines of the memory block during a read operation on the memory block, a temperature measurement circuit configured to measure a temperature before or after the read operation is performed, and output a temperature code corresponding to the measured temperature, and a block read counter configured to determine a read count increment of the memory block depending on the read operation based on the temperature code, and to update a read count value for the memory block by adjusting the read count value depending on the read count increment.

21 Claims, 11 Drawing Sheets

FIG. 4

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2024-0054790 filed on Apr. 24, 2024, the entire disclosure of which is incorporated by reference herein.

BACKGROUND

1. Field of Invention

Various embodiments of the present disclosure generally relate to an electronic device, and more particularly to a semiconductor memory device and a method of operating the semiconductor memory device.

2. Description of Related Art

Semiconductor memory devices are memory devices implemented using a semiconductor such as silicon (Si), germanium (Ge), gallium arsenide (GaAs), or indium phosphide (InP). Semiconductor memory devices are classified into a volatile memory device and a nonvolatile memory device.

The volatile memory device is a memory device in which data stored therein is lost when power supply is interrupted. Representative examples of the volatile memory device include a static random access memory (SRAM), a dynamic RAM (DRAM), a synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change RAM (PRAM), a magnetic RAM (MRAM), a resistive RAM (RRAM), a ferroelectric RAM (FRAM), etc. The flash memory is largely classified into a NOR type and a NAND type.

SUMMARY

Various embodiments of the present disclosure are directed to a semiconductor memory device having improved operational reliability and a method of operating the semiconductor memory device.

An embodiment of the present disclosure may provide for a semiconductor memory device. The semiconductor memory device may include a memory block including a plurality of memory cells, a voltage generation circuit configured to generate a read voltage and a pass voltage to be applied to word lines of the memory block during a read operation on the memory block, a temperature measurement circuit configured to measure a temperature before or after the read operation is performed, and output a temperature code corresponding to the measured temperature, and a block read counter configured to determine a read count increment of the memory block depending on the read operation based on the temperature code, and to update a read count value for the memory block by adjusting the read count value depending on the read count increment.

An embodiment of the present disclosure may provide for a method of operating a semiconductor memory device. The method may include performing N read operations on a selected memory block among a plurality of memory blocks, where N is an integer of 1 or more, measuring a first internal temperature by performing a first temperature measurement operation, determining a new read count increment of the selected memory block by correcting a read count increment of the selected memory block depending on the N read operations based on the measured first internal temperature, and updating a read count value for the selected memory block by adjusting the read count value for the selected memory block based on the new read count increment.

An embodiment of the present disclosure may provide for a method of operating a semiconductor memory device. The method may include measuring a temperature by performing a temperature measurement operation, performing N read operations on a selected memory block among a plurality of memory blocks, where N is an integer of 1 or more, determining a new read count increment of the selected memory block by correcting the read count increment based on the measured temperature, and updating a read count value by adding the new read count increment to the read count value for the selected memory block.

BRIEF DESCRIPTION OF THE DRAWINGS

FIG. 4 is a diagram illustrating an embodiment of the memory cell array of FIG. 1.

DETAILED DESCRIPTION

Advantages and features of the present disclosure, and methods for achieving the same will be shown with reference to embodiments described later in detail together with the accompanying drawings. However, the present disclosure is not limited to the following embodiments but may be embodied in other forms. Rather, various embodiments of the present disclosure are provided to describe the present disclosure in detail so that those skilled in the art to which the present disclosure pertains can easily practice the technical spirit of the present disclosure.

Figure 1:
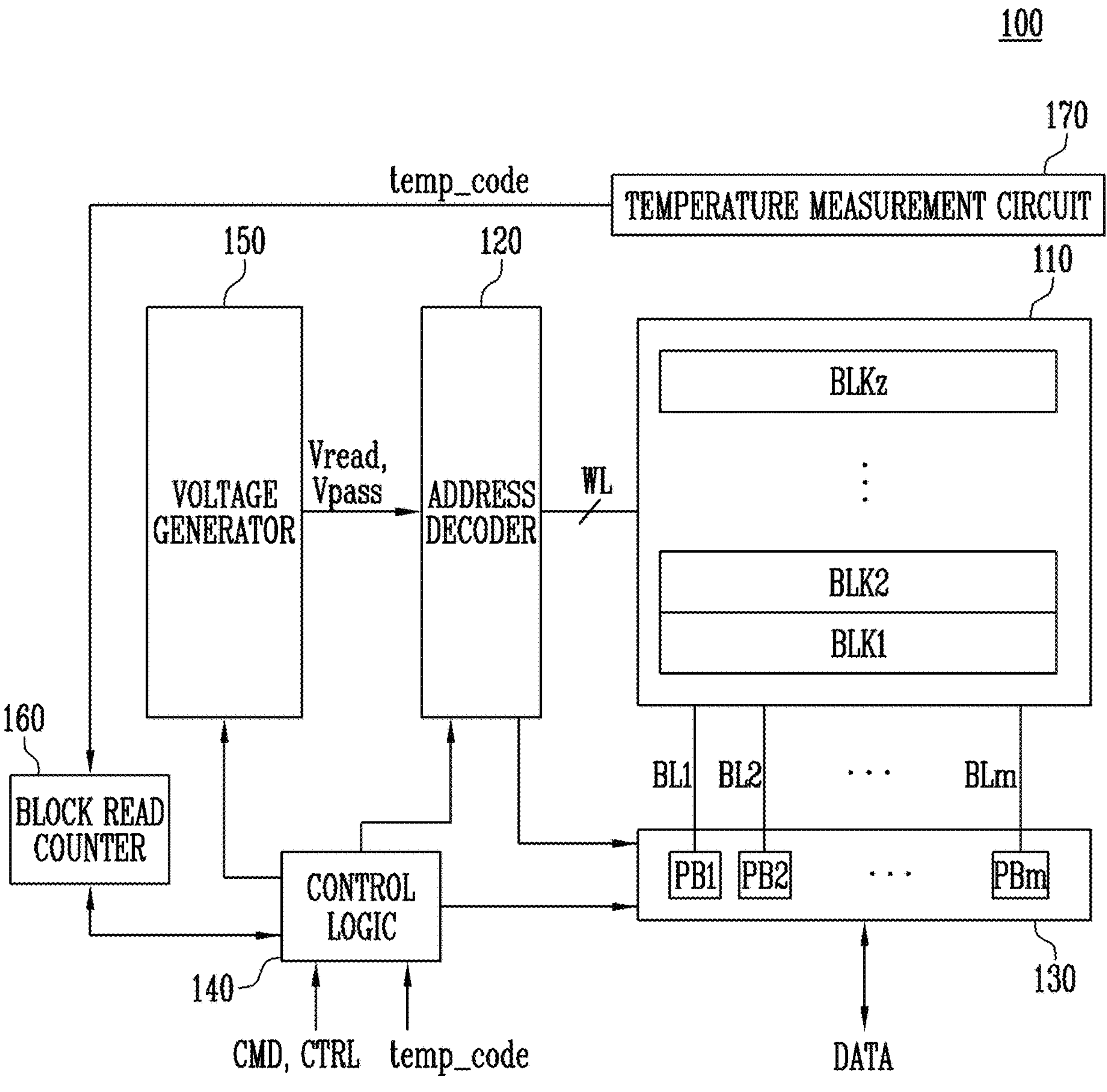
FIG. 1 is a block diagram illustrating a semiconductor memory device according to an embodiment of the present disclosure.

FIG. 1 is a block diagram illustrating a semiconductor memory device 100 according to an embodiment of the present disclosure.

Referring to FIG. 1, the semiconductor memory device 100 includes a memory cell array 110, an address decoder 120, a read and write circuit 130, a control logic 140, a voltage generator 150, a block read counter 160, and a temperature measurement circuit 170.

The memory cell array 110 may include a plurality of memory blocks BLK1 to BLKz. The memory blocks BLK1 to BLKz are connected to the address decoder 120 through word lines WL. The plurality of memory blocks BLK1 to BLKz are connected to the read and write circuit 130 through bit lines BL1 to BLm. Each of the memory blocks BLK1 to BLKz includes a plurality of memory cells. In an embodiment, the plurality of memory cells may be nonvolatile memory cells and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure.

Each of the memory cells included in the memory cell array may store at least 2 bits of data. In an embodiment, each of the memory cells included in the memory cell array 110 may be a multi-level cell (MLC) which stores 2 bits of data. In an embodiment, each of the memory cells included in the memory cell array 110 may be a triple-level cell (TLC) which stores 3 bits of data. In an embodiment, each of the memory cells included in the memory cell array 110 may be a quad-level cell which stores 4 bits of data. In accordance with an embodiment, the memory cell array 110 may include a plurality of memory cells, each of which stores 5 or more bits of data.

The address decoder 120, the read and write circuit 130, and the voltage generator 150 are operated as a peripheral circuit for driving the memory cell array 110. The address decoder 120 is connected to the memory cell array 110 through the word lines WL. The address decoder 120 may be operated under the control of the control logic 140. The address decoder 120 receives addresses through an input/output buffer (not illustrated) provided in the semiconductor memory device 100.

The address decoder 120 may decode a block address among the received addresses. The address decoder 120 selects at least one memory block according to the decoded block address. When a read voltage application operation is performed during a read operation, the address decoder 120 may apply a read voltage Vread, generated by the voltage generator 150, to a selected word line of the selected memory block and apply a pass voltage Vpass to the remaining word lines, that is, unselected word lines. During a program verify operation, the address decoder 120 may apply a verify voltage, generated by the voltage generator 150, to the selected word line of the selected memory block and apply the pass voltage Vpass to the remaining word lines, that is, unselected word lines.

The address decoder 120 may decode a column address among the received addresses. The address decoder 120 may transmit the decoded column address to the read and write circuit 130.

The read and program operations of the semiconductor memory device 100 are each performed on a page basis. The addresses received when each of the read and program operations is requested, may include a block address, a row address, and a column address. The address decoder 120 may select one memory block and one word line according to the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation on the memory cell array 110 and as a "write circuit" during a program operation. The plurality of page buffers PB1 to PBm are connected to the memory cell array 110 through the bit lines BL1 to BLm. In order to sense threshold voltages of the memory cells during a read operation or a program verify operation, each of the page buffers PB1 to PBm may sense a change in the amount of current flowing through a sensing node depending on the program state of a corresponding memory cell while continuously supplying a sensing current to the bit lines connected to the memory cells, and may latch the sensed change as sensing data. The read and write circuit 130 may be operated in response to page buffer control signals output from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page registers).

The control logic 140 may be connected to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. Furthermore, the control logic 140 may output a control signal for controlling a precharge potential level at the sensing node of the plurality of page buffers PB1 to PBm. The control logic 140 may control the read and write circuit 130 to perform a read operation on the memory cell array 110. Further, the control logic 140 may control a read reclaim operation performed on each of the plurality of memory blocks BLK1 to BLKz, based on a read count value for each of the memory blocks BLK1 to BLKz stored in the block read counter 160. To prevent read fail from occurring on a relevant memory block depending on a read operation repeated for the memory block, an operation of reading data from the relevant memory block and storing the read data in a new memory block is referred to as a read reclaim operation. For example, the control logic 140 may control the peripheral circuit to perform a read reclaim operation on a memory block for which the read count value exceeds a set value.

The voltage generator 150 may generate the read voltage Vread and the pass voltage Vpass in response to a voltage generator control signal output from the control logic 140 during a read operation.

The block read counter 160 may count and store the number of read operations performed on each of the plurality of memory blocks BLK1 to BLKz in the memory cell array 110. The number of read operations may be referred to as a "read count value". For example, a read count value for each memory block may be reset when the corresponding memory block is erased or programmed. Thereafter, whenever a read operation is performed on the corresponding memory block, the read count value increases. The block read counter 160 may receive a temperature code temp_code corresponding to internal temperature of the semiconductor memory device 100 measured by the temperature measurement circuit 170. The block read counter 160 may adjust an increment in the read count value based on the received temperature code temp_code. In some embodiments, when the temperature of the semiconductor memory device 100 falls within a preset normal temperature range depending on the received temperature code temp_code, the block read counter 160 may increase the read count value for the corresponding memory block by N when N read operations, where N is an integer of 1 or more, are performed on the corresponding memory block. When the temperature of the semiconductor memory device 100 is lower than the preset normal temperature range depending on the received temperature code temp_code, the block read counter 160 may increase the read count value by (X×N). Here, X may be a number greater than 0 and less than 1. When the temperature of the semiconductor memory device 100 is higher than the preset normal temperature range depending on the received temperature code temp_code, the block read counter 160 may increase the read count value by (Y×N). Here, Y may be a number greater than 1. That is, when the temperature of the semiconductor memory device 100 is high, the block read counter 160 may increase the read count value for the corresponding memory block by a number greater than a normal increment (i.e., N), whereas when the temperature is low, the block read counter 160 may increase the read count value for the corresponding memory block by a number less than the normal increment (i.e., N).

When a command CMD corresponding to a read operation is received, the control logic 140 may set a read voltage to be used in a read operation based on the temperature of the semiconductor memory device 100 measured by the temperature measurement circuit 170, and the read count value for the memory block on which the read operation is to be performed and which is stored in the block read counter 160, and may control the voltage generator 150 to generate the set read voltage.

The temperature measurement circuit 170 may measure the internal temperature of the semiconductor memory device 100 before and after the read operation is performed on the selected memory block, may generate temperature code temp_code corresponding to the measured internal temperature, and may output the generated temperature code temp_code to the control logic 140 and the block read counter 160. The temperature measurement circuit 170 may be arranged physically adjacent to the memory cell array 110.

Although, in FIG. 1, the block read counter 160 is illustrated as a component implemented separately from the control logic 140, the block read counter 160 may be implemented to be included in the control logic 140.

Figure 2:
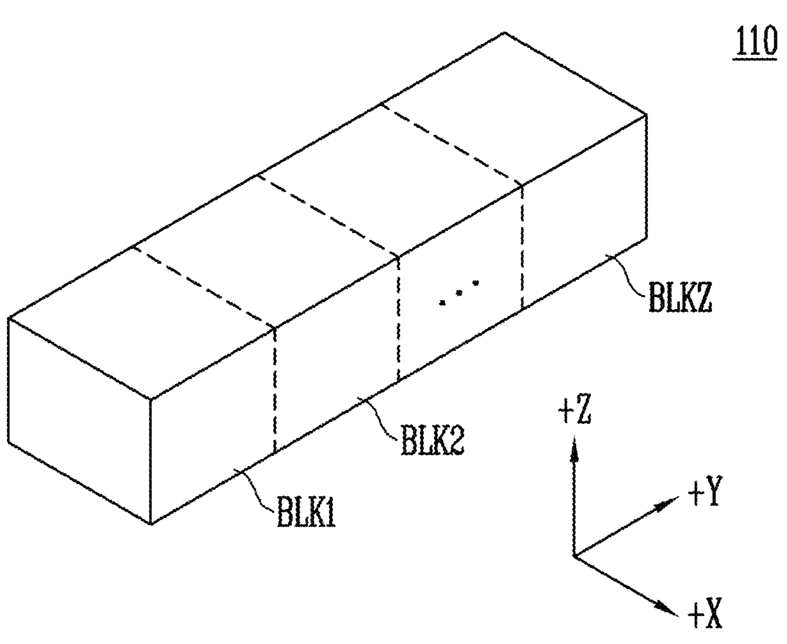
FIG. 2 is a block diagram illustrating an embodiment of a memory cell array of FIG. 1.

FIG. 2 is a block diagram illustrating an embodiment of the memory cell array of FIG. 1.

Referring to FIG. 2, the memory cell array 110 includes a plurality of memory blocks BLK1 to BLKz. Each of the memory blocks may have a three-dimensional (3D) structure. Each of the memory blocks includes a plurality of memory cells stacked on a substrate. The plurality of memory cells are arranged in +X, +Y, and +Z directions. The structure of each memory block configured in a 3D structure will be described in detail later with reference to FIGS. 4 and 5. In some embodiments, unlike the structure illustrated in FIG. 2, each memory block of the memory cell array 110 may have a 2D structure. The memory block having a 2D structure will be described in detail below with reference to FIG. 3.

Figure 3:
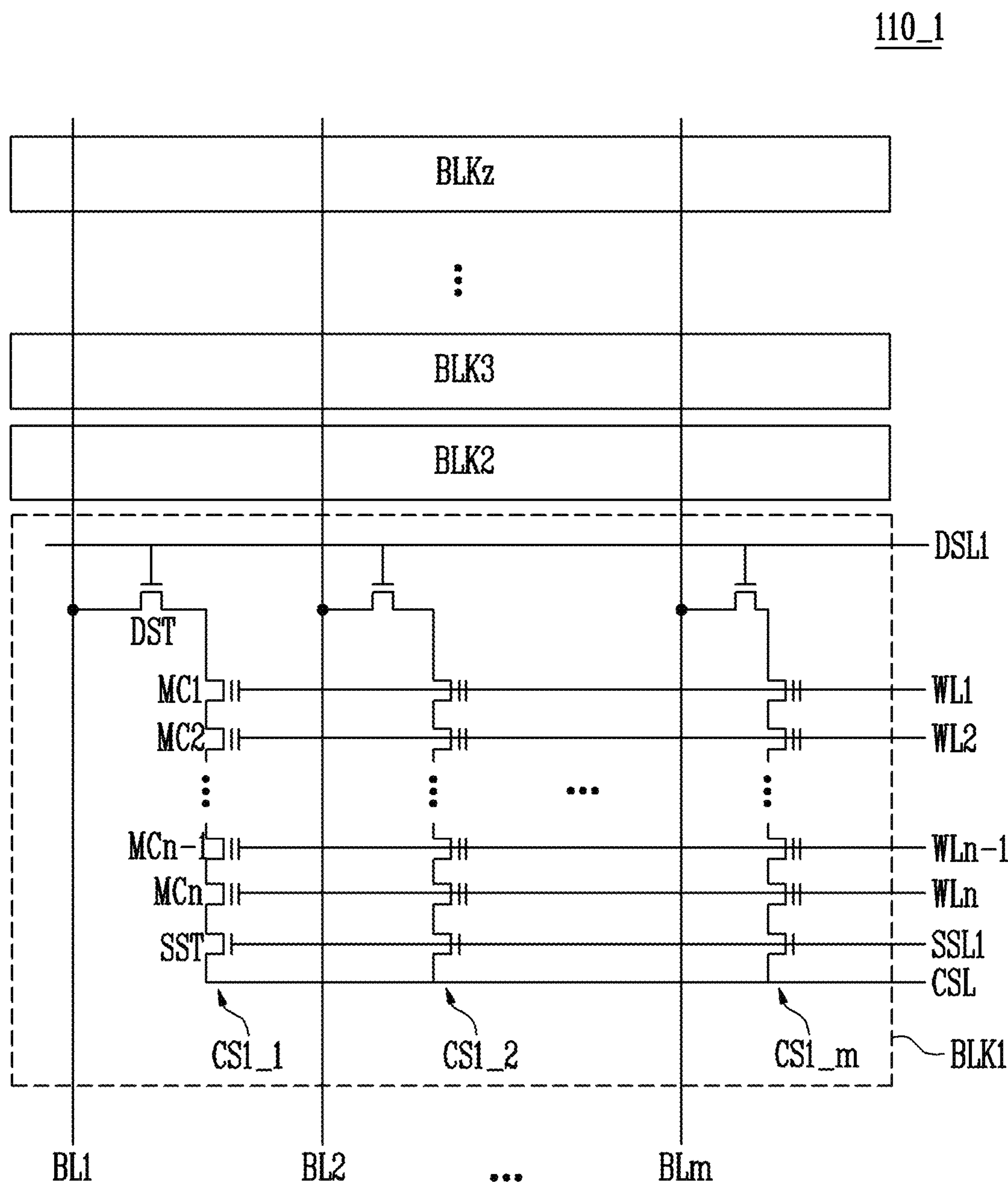
FIG. 3 is a diagram illustrating an embodiment of the memory cell array of FIG. 1.

FIG. 3 is a diagram illustrating an embodiment 110_1 of the memory cell array 110 of FIG. 1.

Referring to FIG. 3, first to z-th memory blocks BLK1 to BLKz included in the memory cell array 110_1 are connected in common to first to m-th bit lines BL1 to BLm. In FIG. 3, for convenience of description, elements included in the first memory block BLK1, among the plurality of memory blocks BLK1 to BLKz, are illustrated, and elements included in each of the remaining memory blocks BLK2 to BLKz are omitted. It will be understood that the remaining memory blocks BLK2 to BLKz are configured in the same manner as the first memory block BLK1.

The memory block BLK1 includes a plurality of cell strings CS1_1 to CS1_*m*. The first to m-th cell strings CS1_1 to CS1_*m* are respectively connected to the first to m-th bit lines BL1 to BLm.

Each of the first to m-th cell strings CS1_1 to CS1_*m* includes a drain select transistor DST, a plurality of memory cells MC1 to MCn which are connected in series to each other, and a source select transistor SST. The drain select transistor DST is connected to a drain select line DSL1. The first to n-th memory cells MC1 to MCn are connected to first to n-th word lines WL1 to WLn, respectively. The source select transistor SST is connected to a source select line SSL1. A drain of the drain select transistor DST is connected to the corresponding bit line. The drain select transistors DST of the first to m-th cell strings CS1_1 to CS1_*m* are connected to the first to m-th bit lines BL1 to BLm, respectively. A source of the source select transistor SST is connected to a common source line CSL. In an embodiment, the common source line CSL may be connected in common to the first to z-th memory blocks BLK1 to BLKz.

The drain select line DSL1, the first to n-th word lines WL1 to WLn, and the source select line SSL1 may be controlled by the address decoder 120. The common source line CSL may be controlled by the control logic 140. The first to m-th bit lines BL1 to BLm may be controlled by the read and write circuit 130.

According to the configuration illustrated in FIG. 3, the memory cell array 110 of the semiconductor memory device 100 according to an embodiment of the present disclosure may be implemented as the memory cell array 110_1 having a 2D structure. However, according to another embodiment, the memory cell array 110 of the semiconductor memory device 100 may be implemented as a memory cell array having a 3D structure. The memory cell array having a 3D structure will be described in detail below with reference to FIGS. 4 and 5.

Figure 4:
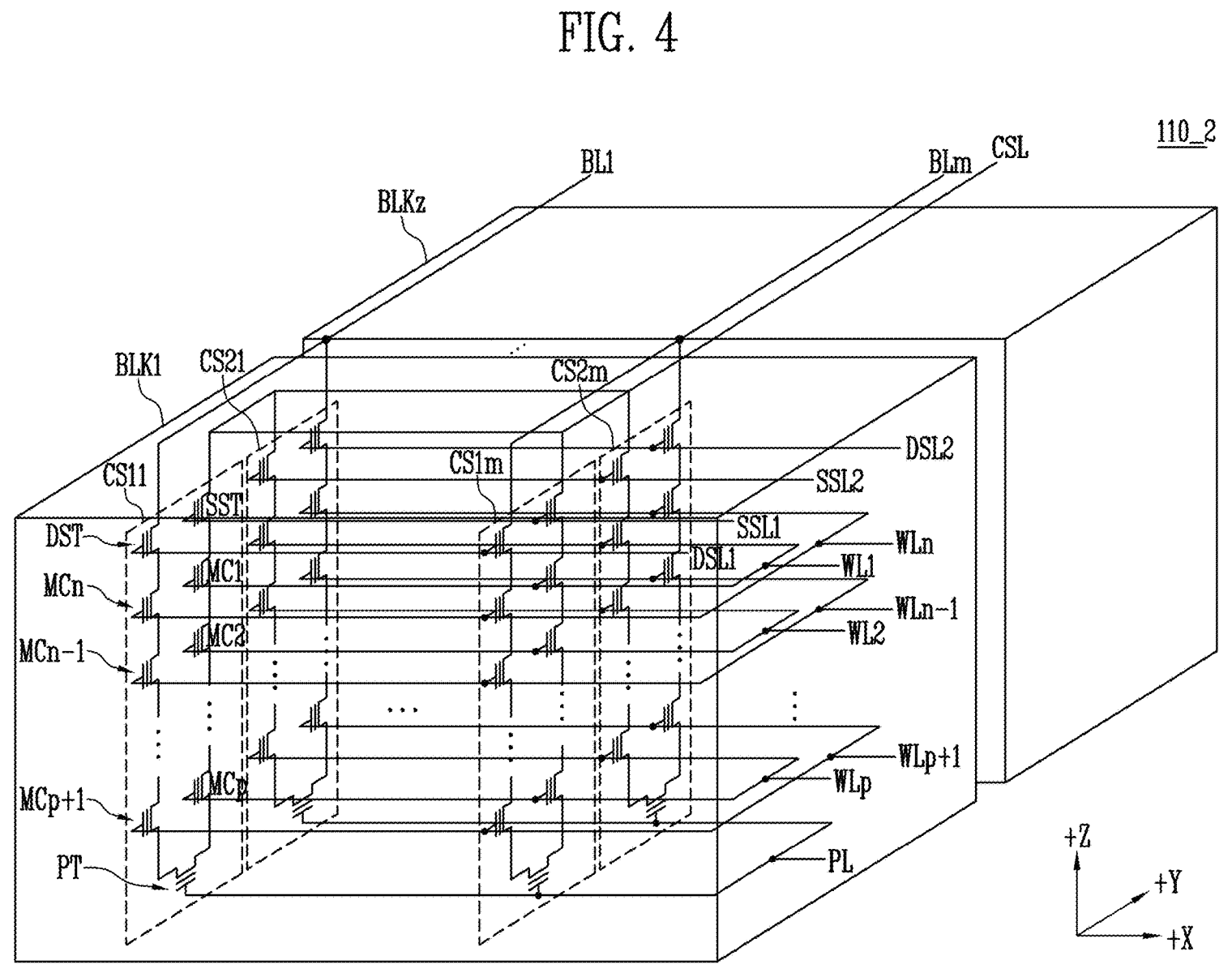

FIG. 4 is a diagram illustrating an embodiment 110_2 of the memory cell array 110 of FIG. 1.

Referring to FIG. 4, the memory cell array 110_2 includes a plurality of memory blocks BLK1 to BLKz. In FIG. 4, for convenience of description, the internal configuration of the first memory block BLK1 is illustrated, and the internal configuration of the remaining memory blocks BLK2 to BLKz is omitted. It will be understood that the second to z-th memory blocks BLK2 to BLKz are configured in the same manner as the first memory block BLK1.

Referring to FIG. 4, the first memory block BLK1 includes a plurality of cell strings CS11 to CS1*m* and CS21 to CS2*m*. In an embodiment, each of the cell strings CS11 to CS1*m* and CS21 to CS2*m* may be formed in a 'U' shape. In the first memory block BLK1, m cell strings are arranged in a row direction (i.e. a positive (+) X direction). In FIG. 4, two cell strings are illustrated as being arranged in a column direction (i.e., a positive (+) Y direction). However, this illustration is made for convenience of description, and it will be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between the common source line CSL and the memory cells MC1 to MCp.

In an embodiment, source select transistors of cell strings arranged in the same row are connected to a source select line extending in a row direction, and source select transistors of cell strings arranged in different rows are connected to different source select lines. In FIG. 4, source select transistors of the cell strings CS11 to CS1*m* in a first row are connected to a first source select line SSL1. Source select transistors of the cell strings CS21 to CS2*m* in a second row are connected to a second source select line SSL2.

In an embodiment, source select transistors of the cell strings CS11 to CS1*m* and CS21 to CS2*m* may be connected in common to one source select line.

The first to n-th memory cells MC1 to MCn in each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to a positive (+) Z direction and are connected in series between the source select transistor SST and the pipe transistor PT. The (p+1)-th to n-th memory cells MCp+1 to MCn are sequentially arranged in the +Z direction and are connected in series between the pipe transistor PT and the drain select transistor DST. The first to p-th memory cells MC1 to MCp and the (p+1)-th to n-th memory cells MCp+1 to MCn are connected to each other through the pipe transistor PT. The gates of the first to n-th memory cells MC1 to MCn of each cell string are connected to first to n-th word lines WL1 to WLn, respectively.

A gate of the pipe transistor PT of each cell string is connected to a pipeline PL.

The drain select transistor DST of each cell string is connected between the corresponding bit line and the memory cells MCp+1 to MCn. The cell strings arranged in the row direction are connected to drain select lines extending in the row direction. Drain select transistors of the cell strings CS11 to CS1*m* in the first row are connected to a first drain select line DSL1. Drain select transistors of the cell strings CS21 to CS2*m* in the second row are connected to a second drain select line DSL2.

Cell strings arranged in the column direction may be connected to bit lines extending in the column direction. In FIG. 4, cell strings CS11 and CS21 in a first column are connected to a first bit line BL1. Cell strings CS1*m* and CS2*m* in an m-th column are connected to an m-th bit line BLm.

Memory cells connected to the same word line in cell strings arranged in the row direction form a single page. For example, memory cells connected to the first word line WL1, among the cell strings CS11 to CS1*m* in the first row, form a single page. Memory cells connected to the first word line WL1, among the cell strings CS21 to CS2*m* in the second row, form another single page. Cell strings arranged in the direction of one row may be selected by selecting one of the drain select lines DSL1 and DSL2. One page may be selected from the selected cell strings by selecting one of the word lines WL1 to WLn.

Figure 5:
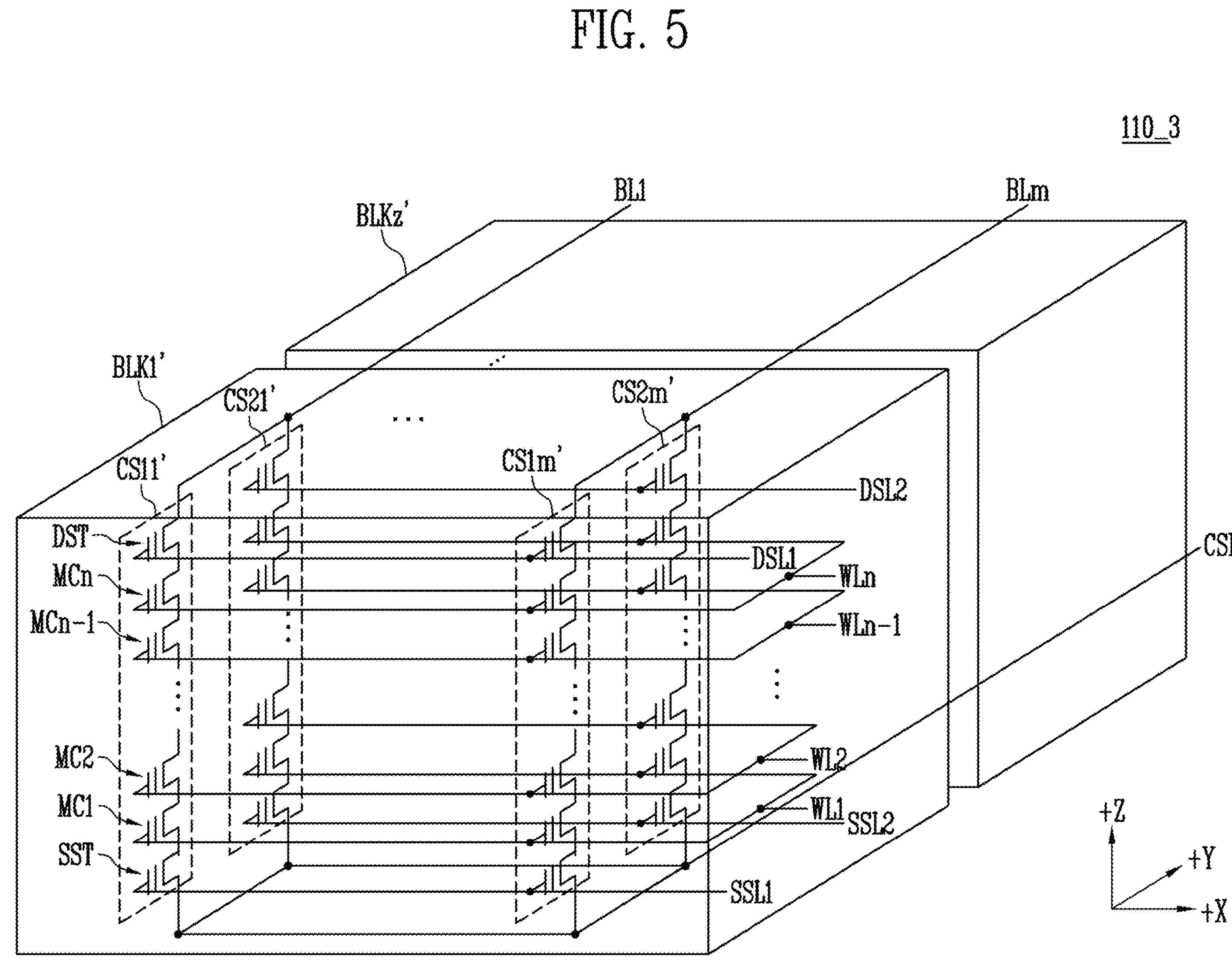
FIG. 5 is a diagram illustrating an embodiment of the memory cell array of FIG. 1.

FIG. 5 is a diagram illustrating an embodiment 110_3 of the memory cell array 110 of FIG. 1.

Referring to FIG. 5, the memory cell array 110_3 includes a plurality of memory blocks BLK1' to BLKz'. In FIG. 5, for convenience of description, the internal configuration of the first memory block BLK1' is illustrated, and the internal configuration of the remaining memory blocks BLK2' to BLKz' is omitted. It will be understood that each of the second to z-th memory blocks BLK2' to BLKz' has the same configuration as the first memory block BLK1'.

The first memory block BLK1' includes a plurality of cell strings CS11' to CS1*m*' and CS21' to CS2*m*'. Each of the cell strings CS11' to CS1*m*' and CS21' to CS2*m*' extends in a +Z direction. In the first memory block BLK1', m cell strings are arranged in a +X direction. In FIG. 5, two cell strings are illustrated as being arranged in a +Y direction. However, this illustration is made for convenience of description, and it will be understood that three or more cell strings may be arranged in the column direction.

Each of the cell strings CS11' to CS1*m*' and CS21' to CS2*m*' includes at least one source select transistor SST, first to n-th memory cells MC1 to MCn, and at least one drain select transistor DST.

The source select transistor SST of each cell string is connected between the common source line CSL and the memory cells MC1 to MCn. The source select transistors of cell strings arranged in the same row are connected to the same source select line. Source select transistors of the cell strings CS11' to CS1*m*' arranged in a first row may be connected to a first source select line SSL1. Source select transistors of the cell strings CS21' to CS2*m*' arranged in a second row may be connected to a second source select line SSL2. In an embodiment, source select transistors of the cell strings CS11' to CS1*m*' and CS21' to CS2*m*' may be connected in common to a single source select line.

The first to n-th memory cells MC1 to MCn in each cell string are connected in series between the source select transistor SST and the drain select transistor DST. Gates of the first to n-th memory cells MC1 to MCn are connected to first to n-th word lines WL1 to WLn, respectively.

The drain select transistor DST of each cell string is connected between the corresponding bit line and the memory cells MC1 to MCn. Drain select transistors of cell strings arranged in the row direction may be connected to drain select lines extending in the row direction. Drain select transistors of the cell strings CS11' to CS1*m*' in the first row are connected to a first drain select line DSL1. Drain select transistors of the cell strings CS21' to CS2*m*' in the second row may be connected to a second drain select line DSL2.

As a result, the memory block BLK1' of FIG. 5 has an equivalent circuit similar to that of the memory block BLK1 of FIG. 4 except that a pipe transistor PT is excluded from each cell string.

Figure 6:
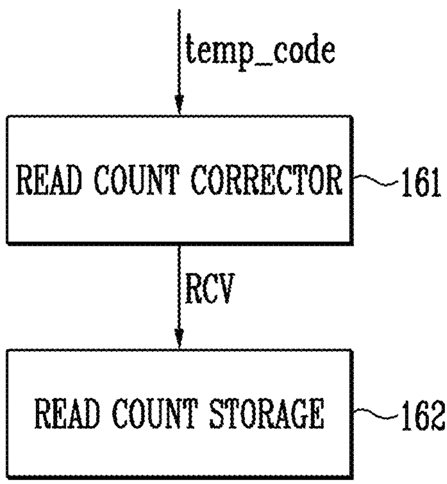
FIG. 6 is a diagram illustrating an embodiment of a block read counter of FIG. 1.

FIG. 6 is a diagram illustrating an embodiment of the block read counter 160 of FIG. 1.

Referring to FIG. 6, the block read counter 160 may include a read count corrector 161 and a read count storage 162.

The read count corrector 161 may receive temperature code temp_code from a temperature measurement circuit (e.g., 170 of FIG. 1), and may correct and count a read count increment RCV based on the received temperature code temp_code. The read count increment RCV may refer to a number by which a read count value for a selected memory block is increased when N read operations, where N is an integer of 1 or more, are performed on the selected memory block. For example, when the temperature code temp_code corresponds to temperature falling within a preset normal temperature range and N read operations are performed on the selected memory block, the read count corrector 161 may count the read count increment RCV for the selected memory block as N. When the received temperature code temp_code corresponds to temperature lower than the preset normal temperature range and N read operations are performed on the selected memory block, the read count corrector 161 may count the read count increment RCV by correcting the read count increment RCV for the selected memory block to a number less than N. When the received temperature code temp_code corresponds to temperature higher than the preset normal temperature range and N read operations are performed on the selected memory block, the read count corrector 161 may count the read count increment RCV by correcting the read count increment RCV for the selected memory block to a number greater than N.

The read count storage 162 may store respective read count values for of the plurality of memory blocks BLK1 to BLKz included in the memory cell array 110 of FIG. 1. The read count storage 162 may receive the read count increment RCV from the read count corrector 161, and may update the read count value for the selected memory block on which the read operation is performed based on the received read count increment RCV. The read count value corresponding to each of the memory blocks, stored in the read count storage 162, may be stored in at least one memory block designated as a system block or a content addressable memory (CAM) block among the plurality of memory blocks BLK1 to BLKz at regular times or respective idle times. The read count value for each of the plurality of memory blocks BLK1 to BLKz, stored in the system block or the CAM block, may be read and then stored in the read count storage 162 during a power-on operation of the semiconductor memory device.

Figure 7:
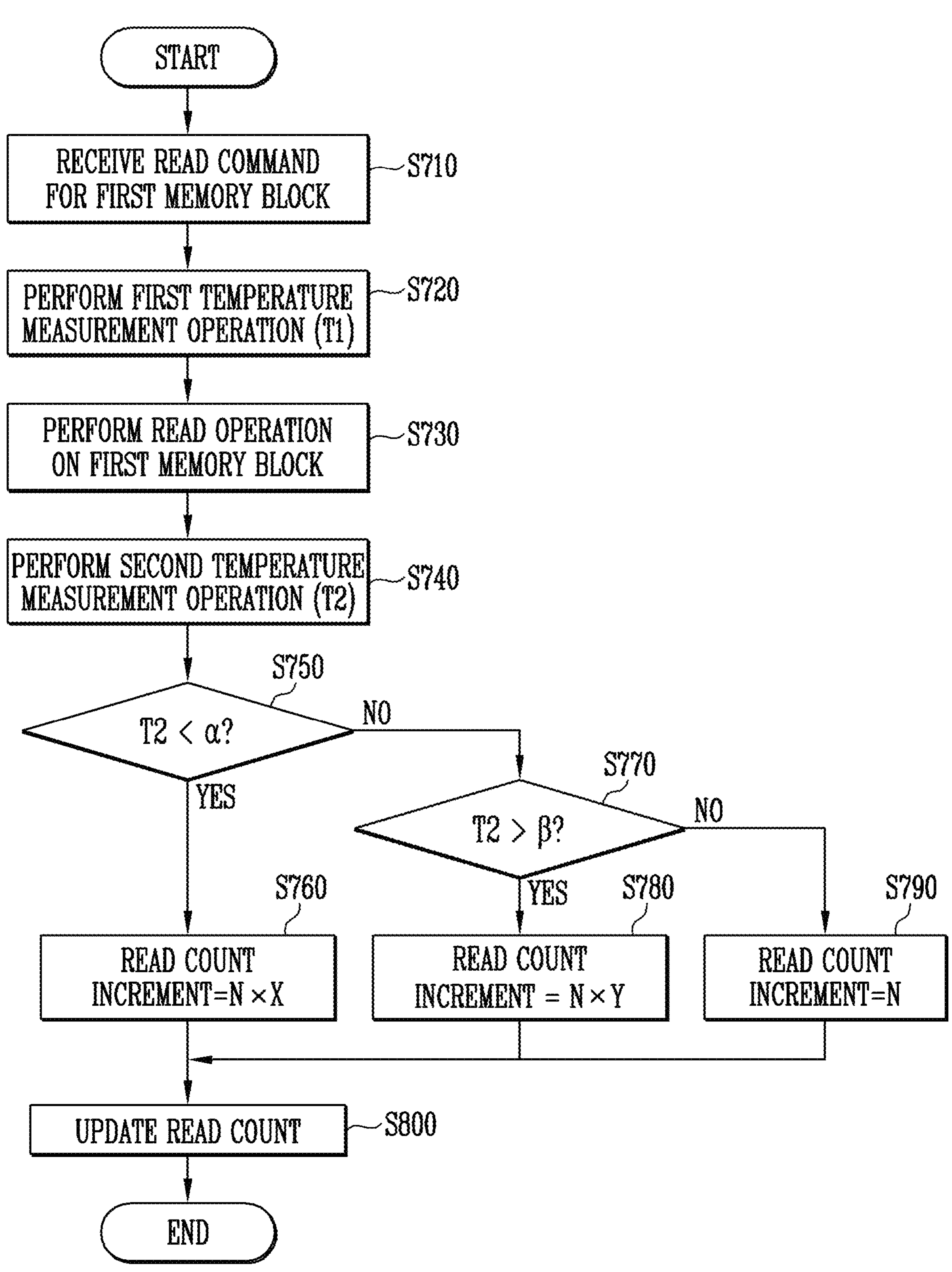
FIG. 7 is a flowchart illustrating a method of operating a semiconductor memory device according to an embodiment of the present disclosure.

FIG. 7 is a flowchart illustrating a method of operating a semiconductor memory device according to an embodiment of the present disclosure.

The method of operating the semiconductor memory device according to the embodiment of the present disclosure will be described below with reference to FIGS. 1 to 7.

At S710, the semiconductor memory device 100 receives a read command for a first memory block from an external device. For example, the semiconductor memory device 100 may receive the read command and an address corresponding to the first memory block from a controller outside the semiconductor memory device 100.

At S720, the temperature measurement circuit 170 may perform a first temperature measurement operation of measuring internal temperature T1 of the semiconductor memory device 100.

The control logic 140 may set a read voltage to be used in a read operation with reference to the internal temperature T1 of the semiconductor memory device 100, measured in the first temperature measurement operation, and a read count value for the first memory block, stored in the read count storage 162.

At S730, a read operation may be performed on the first memory block. The read operation on the first memory block may be performed N times, where N is an integer of 1 or more.

For example, the voltage generator 150 may generate the set read voltage Vread and a pass voltage Vpass under the control of the control logic 140. The address decoder 120 may apply the read voltage Vread, generated by the voltage generator 150, to a selected word line of the first memory block, and apply the pass voltage Vpass to unselected word lines of the first memory block.

The plurality of page buffers PB1 to PBm of the read and write circuit 130 may latch data by sensing the currents or potentials of the corresponding bit lines BL1 to BLm.

At S740, when the read operation on the first memory block is completed, the temperature measurement circuit 170 may measure internal temperature T2 of the semiconductor memory device 100 by performing a second temperature measurement operation, and may generate and output temperature code temp_code corresponding to the measured internal temperature T2.

At S750, the read count corrector 161 may determine whether the internal temperature T2 corresponding to the temperature code temp_code, received from the temperature measurement circuit 170 as a result of the second temperature measurement operation, is lower than first temperature α. The first temperature α may be the lowest temperature falling within a preset normal temperature range.

When it is determined that the internal temperature T2 measured in the second temperature measurement operation is lower than the first temperature α (S750, "Yes"), at S760, the read count corrector 161 may count a read count increment by correcting the read count increment to N×X, where N is the number of read operations performed, and 0<X<1.

When it is determined that the internal temperature T2 measured in the second temperature measurement operation is higher than or equal to the first temperature α (S750, "No"), at S770, the read count corrector 161 may determine whether the internal temperature T2 corresponding to the temperature code temp_code received from the temperature measurement circuit 170 as a result of the second temperature measurement operation is higher than second temperature β. The second temperature β may be higher than the first temperature α and the highest temperature falling within the preset normal temperature range.

When it is determined that the internal temperature T2 measured in the second temperature measurement operation is higher than the second temperature β (S770, "Yes"), at S780, the read count corrector 161 may count the read count increment by correcting the read count increment to N×Y, where N is the number of read operations performed, and 1<Y).

When it is determined that the internal temperature T2 measured in the second temperature measurement operation is lower than or equal to the second temperature β (S770, "No"), at S790, the read count corrector 161 may determine that the internal temperature T2 corresponding to the temperature code temp_code, received from the temperature measurement circuit 170 as a result of the second temperature measurement operation, falls within the preset normal temperature range, and may count the read count increment as N, where N is the number of read operations performed.

At S800, the read count storage 162 may update the read count value for the first memory block based on the read count increment that is counted at the above-described operations S760, S780, or S790. That is, the read count value for the first memory block may be updated by adding the read count increment to the read count value for the first memory block. The updated read count value for the first memory block may be referenced during a new read operation on the first memory block. For example, the control logic 140 may set a read voltage based on the internal temperature of the semiconductor memory device 100 and the updated read count value for the first memory block during the new read operation.

The control logic 140 may control the peripheral circuit, that is, the address decoder 120, the read and write circuit 130, and the voltage generator 150 to perform a read reclaim operation based on the read count value for each of the plurality of memory blocks BLK1 to BLKz.

As described above, according to an embodiment of the present disclosure, after the read operation is performed, the internal temperature of the semiconductor memory device 100 may be measured, and the read count increment may be counted by assigning a weight to the read count value for the memory block on which the read operation is performed based on the measured internal temperature. Accordingly, the reliability of the read operation may be improved by more accurately quantifying read stress of the corresponding memory block depending on the number of read operations (read count) and temperature.

In an embodiment of the present disclosure, although a process of performing N read operations on the selected memory block and thereafter measuring the internal temperature of the semiconductor memory device 100 has been described by way of example, the embodiments of the present disclosure are not limited thereto. For example, it may be possible to perform at least one temperature measurement operation while N read operations are being successively performed and to count a read count increment by correcting the read count increment of the selected memory block based on average temperature obtained as a result of the at least one temperature measurement operation.

In the embodiment of the present disclosure, after the second temperature measurement operation is performed at S740, whether the measured temperature is lower than the first temperature α, falls within a range between the first temperature α and the second temperature β, or is higher than the second temperature β may be determined at S750 and S770, and then the read count increment may be corrected and counted, but the embodiments of the present disclosure are not limited thereto. For example, it may be possible to correct and count the read count increment differently depending on whether the measured temperature is lower than or higher than the first temperature α.

Figure 8:
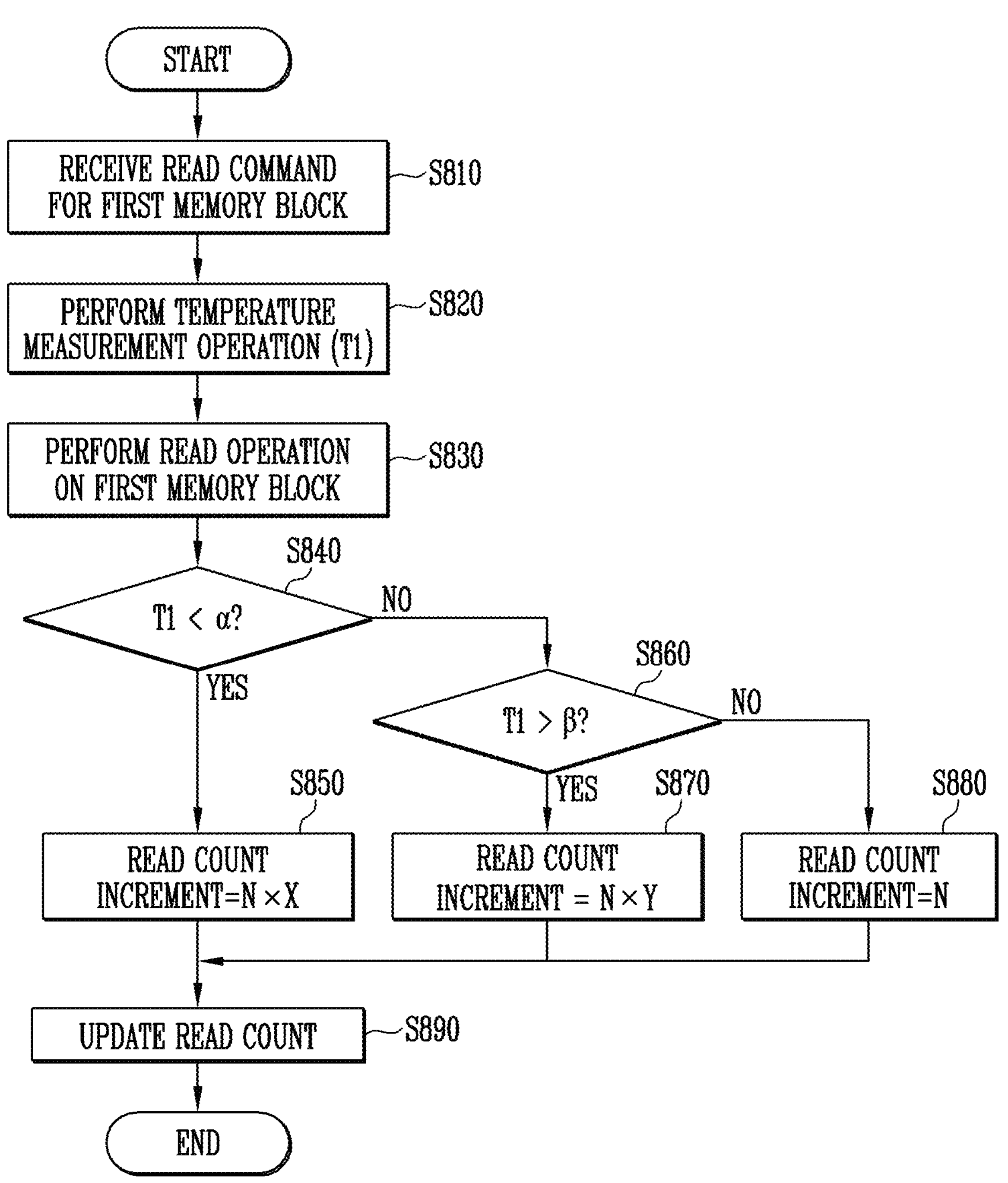
FIG. 8 is a flowchart illustrating a method of operating a semiconductor memory device according to an embodiment of the present disclosure.

FIG. 8 is a flowchart illustrating a method of operating a semiconductor memory device according to an embodiment of the present disclosure.

The method of operating the semiconductor memory device according to an embodiment of the present disclosure will be described below with reference to FIGS. 1 to 6 and 8.

At S810, the semiconductor memory device 100 receives a read command for a first memory block from an external device. For example, the semiconductor memory device 100 may receive the read command and an address corresponding to the first memory block from a controller outside the semiconductor memory device 100.

At S820, the temperature measurement circuit 170 may perform a temperature measurement operation of measuring internal temperature T1 of the semiconductor memory device 100. The temperature measurement circuit 170 may generate and output temperature code temp_code corresponding to the measured internal temperature T1.

The control logic 140 may set a read voltage to be used in a read operation with reference to the internal temperature T1 of the semiconductor memory device 100, measured in the temperature measurement operation, and a read count value for the first memory block, stored in the read count storage 162.

At S830, a read operation may be performed on the first memory block. The read operation on the first memory block may be performed N times, where N is an integer of 1 or more.

For example, the voltage generator 150 may generate the set read voltage Vread and a pass voltage Vpass under the control of the control logic 140. The address decoder 120 may apply the read voltage Vread, generated by the voltage generator 150, to a selected word line of the first memory block, and apply the pass voltage Vpass to unselected word lines of the first memory block.

The plurality of page buffers PB1 to PBm of the read and write circuit 130 may latch data by sensing the currents or potentials of the corresponding bit lines BL1 to BLm.

At S840, the read count corrector 161 may determine whether the internal temperature T1 corresponding to the temperature code temp_code, received from the temperature measurement circuit 170 as a result of the temperature measurement operation, is lower than first temperature α. The first temperature α may be the lowest temperature falling within a preset normal temperature range.

When it is determined that the internal temperature T1 measured in the temperature measurement operation is lower than the first temperature α (S840, "Yes"), at S850, the read count corrector 161 may count a read count increment by correcting the read count increment to N×X, where N is the number of read operations performed, and 0<X<1.

When it is determined that the internal temperature T1 measured in the temperature measurement operation is higher than or equal to the first temperature α (S840, "No"), at S860, the read count corrector 161 may determine whether the internal temperature T1 corresponding to the temperature code temp_code, received from the temperature measurement circuit 170 as a result of the temperature measurement operation, is higher than second temperature β. The second temperature β may be higher than the first temperature α and the highest temperature falling within the preset normal temperature range.

When it is determined that the internal temperature T1 measured in the temperature measurement operation is higher than the second temperature β (S860, "Yes"), at S870, the read count corrector 161 may count the read count increment by correcting the read count increment to N×Y, where N is the number of read operations performed, and 1<Y.

When it is determined that the internal temperature T1 measured in the temperature measurement operation is lower than or equal to the second temperature β (S860, "No"), at S880, the read count corrector 161 may determine that the internal temperature T1 corresponding to the temperature code temp_code, received from the temperature measurement circuit 170 as a result of the temperature measurement operation, falls within the preset normal temperature range, and may count the read count increment as N, where N is the number of read operations performed.

At S890, the read count storage 162 may update the read count value for the first memory block based on the read count increment that is counted at the above-described operations S850, S870, or S880. That is, the read count value for the first memory block may be updated by adding the read count increment to the read count value for the first memory block. The updated read count value for the first memory block may be referenced during a new read operation on the first memory block. For example, the control logic 140 may set a read voltage based on the internal temperature of the semiconductor memory device 100 and the updated read count value for the first memory block during the new read operation.

In an embodiment of the present disclosure, after the read operation is performed on the first memory block at S830, whether the measured temperature is lower than the first temperature α, falls within a range between the first temperature α and the second temperature β, or is higher than the second temperature β may be determined at operations S840 and S860, and then the read count increment may be corrected and counted, but the embodiments of the present disclosure are not limited thereto. For example, it may be possible to correct and count the read count increment differently depending on whether the measured temperature is lower than or higher than the first temperature α.

As described above, according to an embodiment of the present disclosure, just before the read operation is performed, the internal temperature of the semiconductor memory device 100 may be measured, and the read count increment may be counted by assigning a weight to the read count value for the memory block on which the read operation is performed based on the measured internal temperature. Accordingly, the reliability of the read operation may be improved by more accurately quantifying read stress of the corresponding memory block depending on the number of read operations (read count) and temperature.

Figure 9:
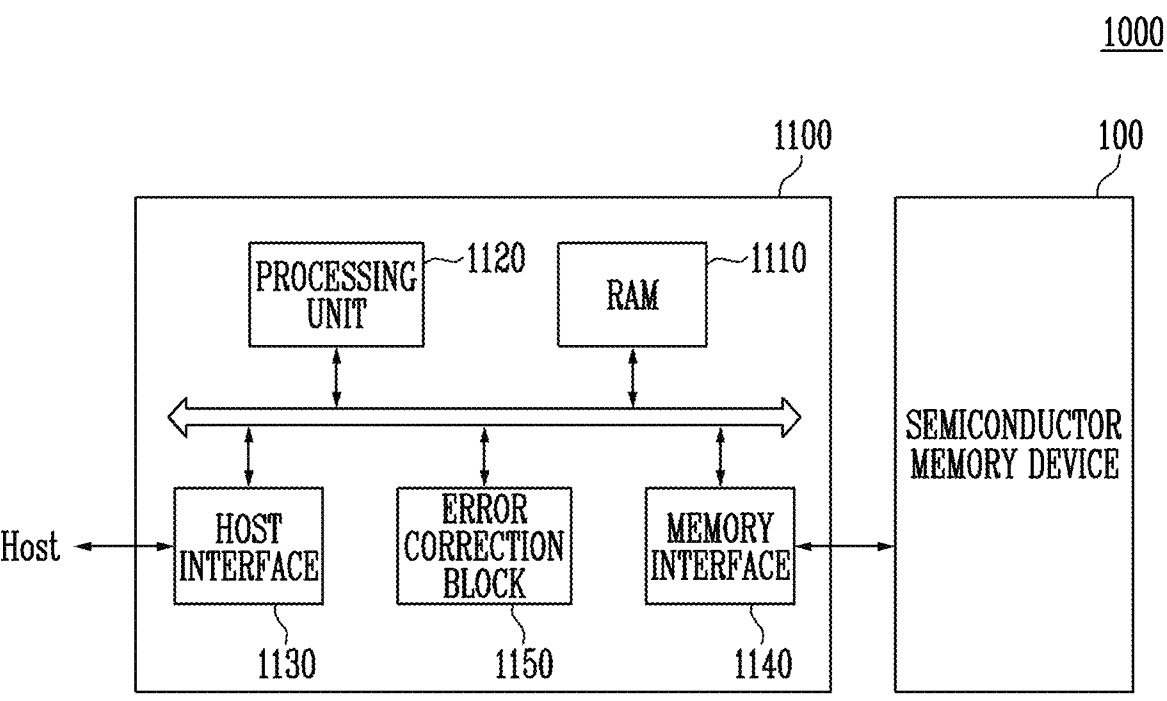
FIG. 9 is a block diagram illustrating a memory system including the semiconductor memory device of FIG. 1.

FIG. 9 is a block diagram illustrating a memory system 1000 including the semiconductor memory device of FIG. 1.

Referring to FIG. 9, the memory system 1000 includes a semiconductor memory device 100 and a controller 1100. The semiconductor memory device 100 may be the semiconductor memory device described with reference to FIG. 1. Hereinafter, repetitive descriptions will be omitted.

The controller 1100 is connected to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may run firmware for controlling the semiconductor memory device 100.

The controller 1100 includes a random access memory (RAM) 1110, a processing unit 1120, a host interface 1130, a memory interface 1140, and an error correction block 1150. The RAM 1110 may be used as at least one of a working memory for the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during a write operation.

The host interface 1130 includes a protocol for performing data exchange between the host Host and the controller 1100. In an embodiment, the controller 1100 may communicate with the host Host through at least one of various communication standards or interfaces such as a universal serial bus (USB) protocol, a multimedia card (MMC) protocol, a peripheral component interconnection (PCI) protocol, a PCI-express (PCI-e or PCIe) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or NOR interface.

The error correction block 1150 may detect and correct errors in data received from the semiconductor memory device 100 using an error correction code (ECC). The processing unit 1120 may adjust a read voltage based on the result of error detection by the error correction block 1150, and may control the semiconductor memory device 100 to re-perform a read operation using the adjusted read voltage. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card, such as a personal computer memory card international association (PCMCIA), a compact flash card (CF), a smart media card (SM or SMC), a memory stick, a multimedia card (MMC, RS-MMC, or MMCmicro), a secure digital (SD) card (SD, miniSD, microSD, or SDHC), or a universal flash storage (UFS).

The controller 1100 and the semiconductor memory device 100 may be integrated into a single semiconductor device to form a solid state drive (SSD). The SSD includes a storage device configured to store data in a semiconductor memory. When the memory system 1000 is used as the SSD, the operating speed of the host Host connected to the memory system 2000 may be remarkably improved.

In an embodiment, the memory system 1000 may be provided as one of various elements of an electronic device, such as a computer, an ultra-mobile PC (UMPC), a workstation, a net-book, a personal digital assistants (PDA), a portable computer, a web tablet, a wireless phone, a mobile phone, a smartphone, a wearable device, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices constituting a computer network, one of various electronic devices constituting a telematics network, an RFID device, or one of various elements constituting a computing system.

In an embodiment, the semiconductor memory device 100 or the memory system 1000 may be mounted in various types of packages. For example, the semiconductor memory device 100 or the memory system 1000 may be packaged and mounted in a type such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flatpack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP).

Figure 10:
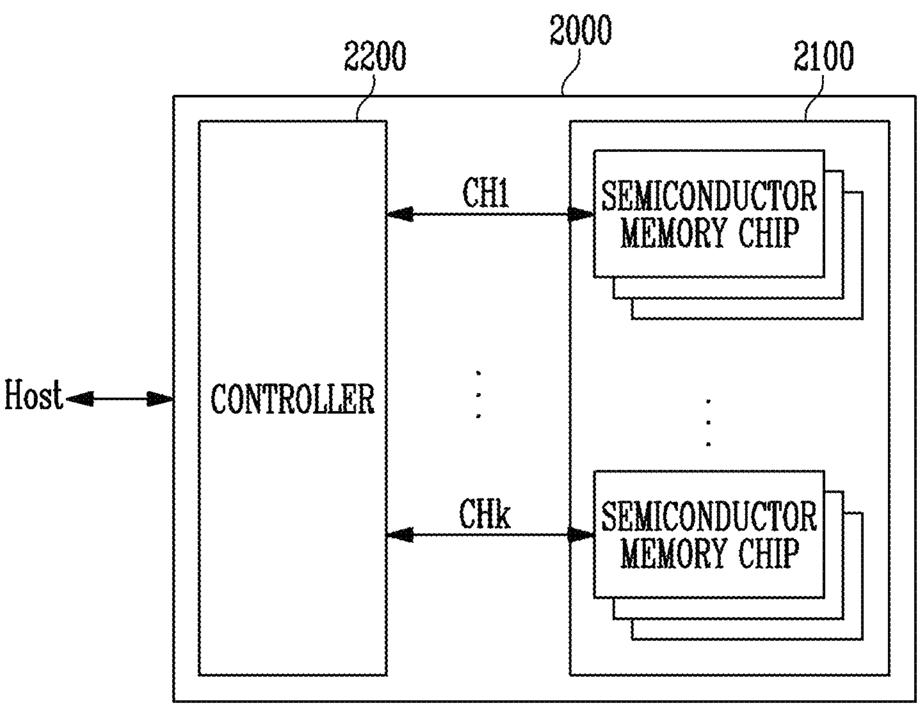
FIG. 10 is a block diagram illustrating application of the memory system of FIG. 9.

FIG. 10 is a block diagram illustrating an application of the memory system of FIG. 9.

Referring to FIG. 10, a memory system 2000 includes a semiconductor memory device 2100 and a controller 2200. The semiconductor memory device 2100 may include a plurality of semiconductor memory chips. The semiconductor memory chips are divided into a plurality of groups.

In FIG. 10, the plurality of groups are illustrated as communicating with the controller 2200 through first to k-th channels CH1 to CHk, respectively. Each semiconductor memory chip may be configured and operated in the same manner as the semiconductor memory device 100 described with reference to FIG. 1.

Each group may communicate with the controller 2200 through one common channel. The controller 2200 may be configured in the same manner as the controller 1100 described with reference to FIG. 9, and may be configured to control the plurality of memory chips of the semiconductor memory device 2100 through the plurality of channels CH1 to CHk.

Figure 11:
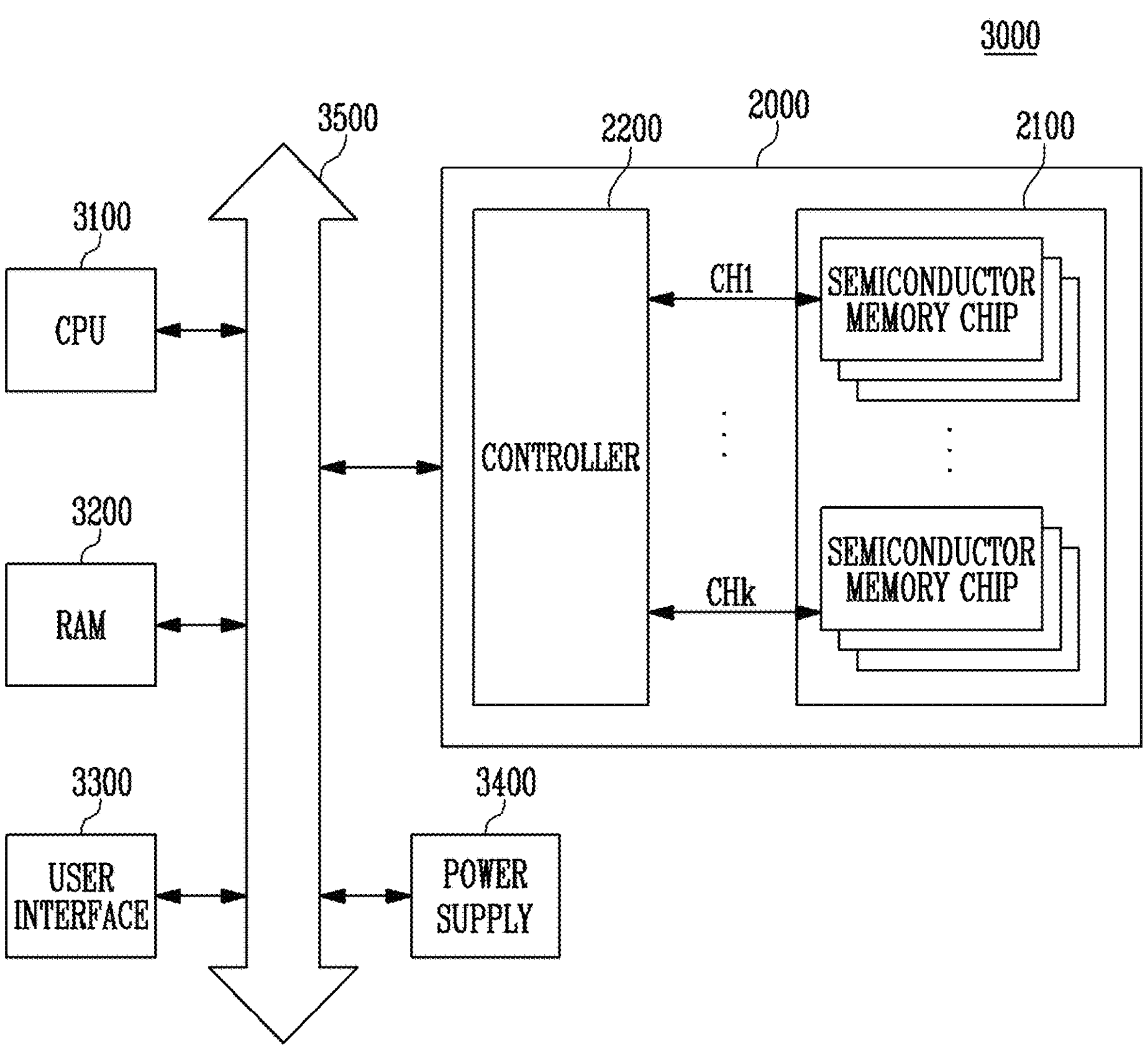
FIG. 11 is a block diagram illustrating a computing system including the memory system described with reference to FIG. 10.

FIG. 11 is a block diagram illustrating a computing system 3000 including the memory system 2000 described with reference to FIG. 10.

Referring to FIG. 11, the computing system 3000 may include a central processing unit (CPU) 3100, a RAM 3200, a user interface 3300, a power supply 3400, a system bus 3500, and the memory system 2000.

The memory system 2000 is electrically connected to the CPU 3100, the RAM 3200, the user interface 3300, and the power supply 3400 through the system bus 3500. Data provided through the user interface 3300 or processed by the CPU 3100 may be stored in the memory system 2000.

In FIG. 11, the semiconductor memory device 2100 is illustrated as being connected to the system bus 3500 through the controller 2200. However, the semiconductor memory device 2100 may be directly connected to the system bus 3500. Here, the function of the controller 2200 may be performed by the CPU 3100 and the RAM 3200.

In FIG. 11, the memory system 2000 described with reference to FIG. 10 is illustrated as being provided. However, the memory system 2000 may be replaced with the memory system 1000 described with reference to FIG. 9. In an embodiment, the computing system 3000 may include both memory systems 1000 and 2000 described with reference to FIGS. 9 and 10.

According to the embodiments of the present disclosure, the reliability of a semiconductor memory device may be improved by adjusting an increment in a read count based on temperature.

The embodiments of the present disclosure disclosed in the present specification and drawings are merely intended to present specific examples to easily describe the technical details of the present disclosure for convenience of understanding of the present disclosure, and are not intended to limit the scope of the present disclosure. It is apparent to those skilled in the art to which the present disclosure pertains that various modifications based on the technical spirit of the present disclosure are possible in addition to the disclosed embodiments. Furthermore, the embodiments may be combined to form additional embodiments.

What is claimed is:

1. A semiconductor memory device comprising:

a memory block including a plurality of memory cells;

a voltage generation circuit configured to generate a read voltage and a pass voltage to be applied to word lines of the memory block during a read operation on the memory block;

a temperature measurement circuit configured to measure a temperature before or after the read operation is performed, and output a temperature code corresponding to the measured temperature; and a block read counter configured to determine a read count increment of the memory block depending on the read operation based on the temperature code, and to update a read count value for the memory block by adjusting the read count value depending on the read count increment.

2. The semiconductor memory device according to claim 1, further comprising:

a control logic configured to control the voltage generation circuit, wherein the control logic is configured to set a level of the read voltage to be used in the read operation based on the read count value for the memory block.

3. The semiconductor memory device according to claim 2, wherein:

the temperature measurement circuit measures the temperature before the read operation, and the control logic is configured to set the level of the read voltage used in the read operation based on the temperature and the read count value.

4. The semiconductor memory device according to claim 1, wherein the control logic is configured to determine whether a read reclaim operation is to be performed on the memory block, based on the read count value for the memory block.

5. The semiconductor memory device according to claim 1, wherein the block read counter determines the read count increment by correcting the read count increment to a first value when the temperature is lower than a reference temperature depending on N read operations performed on the memory block, and by correcting the read count increment to a second value greater than the first value when the temperature is higher than the reference temperature, where N is a positive integer of 1 or more.

6. The semiconductor memory device according to claim 1, wherein:

the block read counter is configured to, depending on N read operations performed on the memory block where N is an integer of 1 or more, when the temperature falls within a preset temperature range, increase the read count value for the memory block by the read count increment N, when the temperature is lower than the preset temperature range, increase the read count value for the memory block by the read count increment ($X \times N$), where X is greater than 0 and less than 1, and when the temperature is higher than the preset temperature range, increase the read count value for the memory block by the read count increment ($Y \times N$), where Y is a number greater than 1.

7. The semiconductor memory device according to claim 6, wherein the block read counter comprises:

a read count corrector configured to correct and count the read count increment based on the temperature code; and a read count storage configured to update and store the read count value for the memory block on which the read operation is performed, based on the read count increment.

8. The semiconductor memory device according to claim 7, wherein the read count corrector is configured to:

correct the read count increment by decreasing a value of the read count increment when a temperature corresponding to the temperature code is lower than a first temperature that is a lowest temperature within the preset temperature range, and correct the read count increment by increasing a value of the read count increment when the temperature corresponding to the temperature code is higher than a second temperature that is a highest temperature within the preset temperature range.

9. The semiconductor memory device according to claim 1, further comprising:

a system block or a content addressable memory (CAM) block configured to store the read count value.

10. The semiconductor memory device according to claim 9, wherein the read count value stored in the system block or the CAM block is read and stored in the block read counter during a power-on operation.

11. A method of operating a semiconductor memory device, the method comprising:

performing N read operations on a selected memory block among a plurality of memory blocks, where N is an integer of 1 or more;

measuring a first internal temperature by performing a first temperature measurement operation;

determining a new read count increment of the selected memory block by correcting a read count increment of the selected memory block depending on the N read operations based on the measured first internal temperature; and updating a read count value for the selected memory block by adjusting the read count value for the selected memory block based on the new read count increment.

12. The method according to claim 11, wherein determining the new read count increment comprises:

when the measured first internal temperature is lower than a preset temperature range, correcting the read count increment by decreasing the read count increment from N; and when the measured first internal temperature is higher than the preset temperature range, correcting the read count increment by increasing the read count increment from N.

13. The method according to claim 12, wherein the new read count increment further comprises:

when the first internal temperature falls within the preset temperature range, determining the new read count increment as N.

14. The method according to claim 11, further comprising:

performing a second temperature measurement operation before the read operation is performed, and setting a level of a read voltage to be used in the read operation based on a temperature measured in the second temperature measurement operation.

15. The method according to claim 11, wherein the first temperature measurement operation is performed after the N read operations are terminated, or is performed at least once while the N read operations are being performed.

16. The method according to claim 11, further comprising:

setting a read voltage for a new read operation on the selected memory block based on the updated read count value.

17. A method of operating a semiconductor memory device, the method comprising:

measuring a temperature by performing a temperature measurement operation;

performing N read operations on a selected memory block among a plurality of memory blocks, where N is an integer of 1 or more;

determining a new read count increment of the selected memory block by correcting a read count increment based on the measured temperature; and updating a read count value by adding the new read count increment to the read count value for the selected memory block.

18. The method according to claim 17, wherein determining the new read count increment comprises:

when the measured temperature is lower than a preset temperature range, correcting the read count increment by decreasing the read count increment to a value less than N; and when the measured temperature is higher than the preset temperature range, correcting the read count increment by increasing the read count increment to a value greater than N.

19. The method according to claim 18, wherein determining the new read count increment further comprises:

when the temperature falls within the preset temperature range, determining the new read count increment as N.

20. The method according to claim 17, further comprising:

before the read operation is performed on the selected memory block, setting a read voltage to be used in the read operation based on the temperature.

21. The method according to claim 17, further comprising:

setting a read voltage for a new read operation on the selected memory block based on the updated read count value.

* * * * *